US012674771B2

(12) United States Patent
Chu et al.

(10) Patent No.: US 12,674,771 B2
(45) Date of Patent: Jul. 7, 2026

(54) METHODS AND APPARATUS FOR INTEGRATING DIAMOND WITH LED TOWARDS ON-CHIP QUANTUM SENSING

(71) Applicant: VERSITECH LIMITED, Hong Kong (CN)

(72) Inventors: Zhiqin Chu, Hong Kong (CN); Jixiang Jing, Hong Kong (CN); Feng Xu, Hong Kong (CN)

(73) Assignee: VERSITECH LIMITED, Hong Kong (CN)

( * ) Notice: Subject to any disclaimer, the term of this patent is extended or adjusted under 35 U.S.C. 154(b) by 459 days.

(21) Appl. No.: 18/279,792

(22) PCT Filed: Feb. 11, 2022

(86) PCT No.: PCT/CN2022/076011
§ 371 (c)(1),
(2) Date: Aug. 31, 2023

(87) PCT Pub. No.: WO2022/183895
PCT Pub. Date: Sep. 9, 2022

(65) Prior Publication Data
US 2024/0167970 A1 May 23, 2024

Related U.S. Application Data

(60) Provisional application No. 63/155,354, filed on Mar. 2, 2021.

(51) Int. Cl.
G01N 24/00 (2006.01)
G01N 24/10 (2006.01)
(Continued)

(52) U.S. Cl.
CPC .......... G01N 24/006 (2013.01); G01N 24/10 (2013.01); H10H 20/811 (2025.01); H10H 20/8215 (2025.01)

(58) Field of Classification Search
CPC .... G01N 24/006; G01N 24/10; H10H 20/811; H10H 20/8215
See application file for complete search history.

(56) References Cited

U.S. PATENT DOCUMENTS 9,823,313 B2 * 11/2017 Hahn ..................... G01R 33/60
10,901,054 B1 1/2021 Chen et al.
(Continued)

FOREIGN PATENT DOCUMENTS

CN 105137126 A 12/2015
CN 108061548 A 5/2018

OTHER PUBLICATIONS

International Search Report and Written Opinion in corresponding International Application No. PCT/CN2022/076011, mailed Apr. 28, 2022, 5 pages.

*Primary Examiner* — Gregory H Curran
(74) *Attorney, Agent, or Firm* — Leason Ellis LLP

(57) ABSTRACT

A small volume optoelectronic chip contains an LED chip with a diamond having nitrogen-vacancy centers embedded therein. The LED chip generates light having a first wavelength, and the diamond with nitrogen-vacancy centers generates light having a second wavelength after excitement with light having the first wavelength. The diamond may also be on or adjacent the LED.

14 Claims, 5 Drawing Sheets

(51) Int. Cl.
   *H10H 20/81*      (2025.01)
   *H10H 20/811*     (2025.01)

(56)                  References Cited

U.S. PATENT DOCUMENTS

| 12,326,486 | B2 * | 6/2025 | Meijer ................... G01R 33/26 |
| 2005/0253159 | A1 * | 11/2005 | Creswick ............. H10W 70/68 |
| | | | 257/98 |
| 2015/0362151 | A1 | 12/2015 | Van Bommel et al. |
| 2017/0343618 | A1 * | 11/2017 | Hahn ................... G01R 33/032 |
| 2019/0317173 | A1 | 10/2019 | Connolly et al. |
| 2020/0057117 | A1 | 2/2020 | Nishibayashi et al. |

* cited by examiner

FIG. 3A

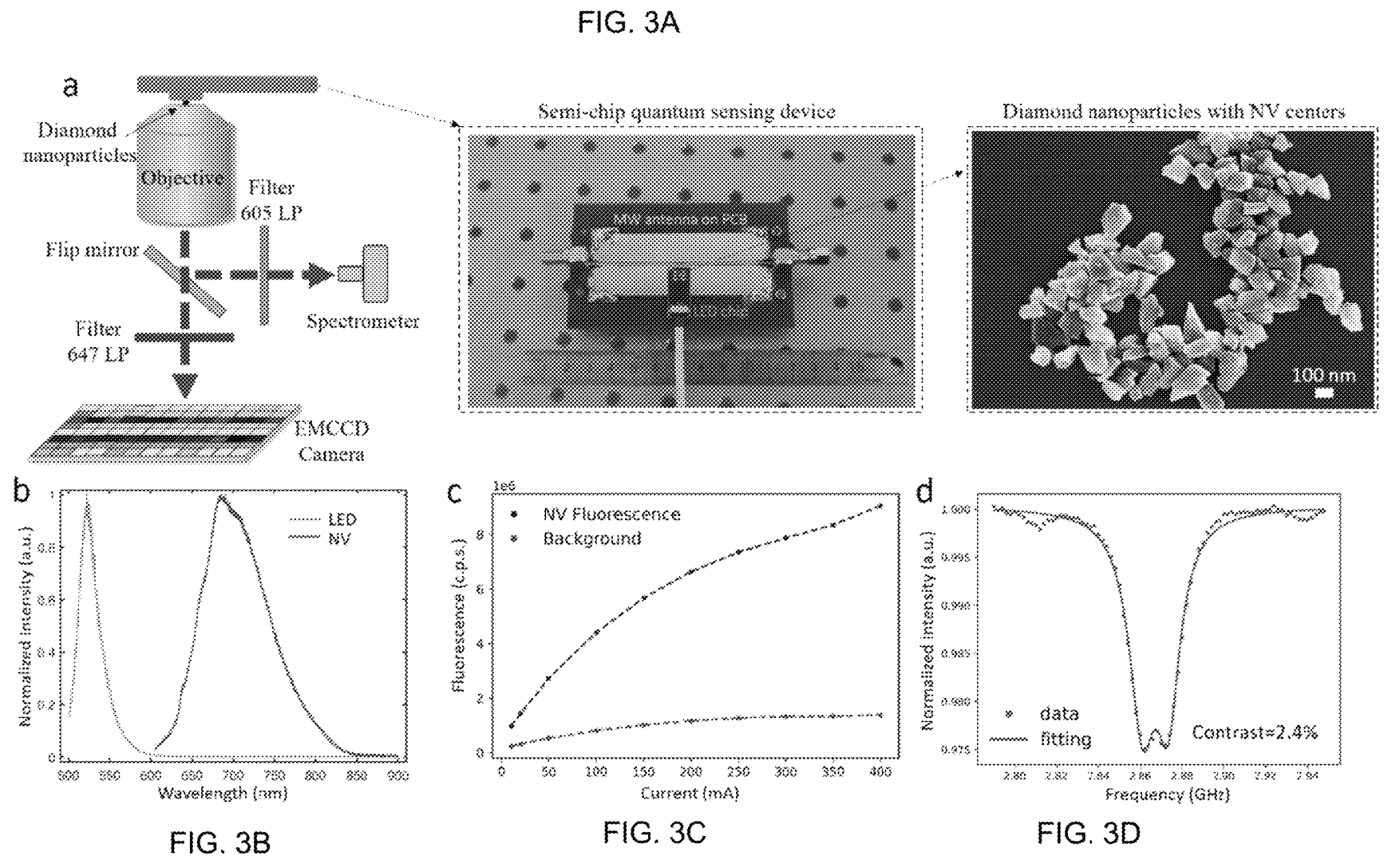

Diamond nanoparticles with NV centers 100 nm

Semi-chip quantum sensing device a

Diamond nanoparticles

Objective

Filter 605 LP

Flip mirror

Spectrometer

Filter 647 LP

EMCCD Camera b

Normalized Intensity (a.u.)

LED
NV

Wavelength (nm)

FIG. 3B c

Fluorescence (c.p.s.)

1e6

NV Fluorescence
Background

Current (mA)

FIG. 3C d

Normalized Intensity (a.u.)

Contrast=7.4% data
fitting

Frequency (GHz)

FIG. 3D

◊    Diamond particle

⬜    Diamond plate

▦    LED chip (a)    Diamond (on-top)

Face-up LED

The power into diamond is
0.725041 W.

(b)    Diamond (on-top)

Flip-chip LED

The power into diamond is
0.964563 W.

(c)    Diamond (aside)

The power into diamond is
0.120110 W.

(d)    Diamond (inside)

The power into diamond is
0.309240 W.

METHODS AND APPARATUS FOR INTEGRATING DIAMOND WITH LED TOWARDS ON-CHIP QUANTUM SENSING

This application a U.S. National Stage Application under 35 U.S.C. § 371 of international patent application No. PCT/CN2022/076011, filed Feb. 11, 2022 and claims the benefit of priority under 35 U.S.C. § 119(c) of U.S. Provisional Patent Application No. 63/155,354 filed on Mar. 2, 2021, the entire contents of which are incorporated herein by reference in their entireties for all purposes. The PCT application was published in English on Sep. 9, 2022 as WO2022/183895 A1.

TECHNICAL FIELD

The present invention relates to small volume devices for integrating diamonds with an LED for on-chip quantum sensing.

BACKGROUND OF THE INVENTION

Nitrogen vacancy (NV) centers are defects in the crystal structure of diamond. NV centers can occur naturally, or be manufactured in synthetic diamonds. When excited by light and/or microwave radiation having a first wavelength, the NV centers cause the diamond to generate light of a second wavelength. Typically, the second wavelength light/radiation is different enough from the first wavelength light/radiation, i.e., visibly different (different to the naked eye) light is generated. When an excited NV center diamond is exposed to an external stimulus, such as an external magnetic field, the frequency of the microwave radiation at which the diamond generates red light and the intensity of the light change. By measuring the change and comparing it to the microwave frequency that the diamond generates when not in the presence of the external stimulus, the NV centers can be used to accurately detect a desired property, such as the magnetic field strength.

There is a lack of integrated light sources for NV-based quantum sensing. A complicated laser system with various necessary accessories is commonly adopted in quantum sensing setups for NV excitation. However, this system not only occupies a large amount of space (~m³ volume) on an optical table, but also has huge economic costs. Moreover, the lack of portability leads to various limitations for a number of useful applications as well.

US Patent Application Publication No. US2015/0362151 of Van Bommel et al. discloses a light source comprising a light emitting device, e.g., a light emitting diode, and a light conversion element directly applied on the light exit window of the light emitting device.

CN108061548 discloses an integrated diamond NV fluorescence excitation and collection system comprising a laser diode, a diamond, a filter and a photoelectric converter. The diamond is located on the top of the laser diode. The filter and photoelectric converter are located at the bottom of the laser diode.

SUMMARY OF THE INVENTION

The following presents a simplified summary of the invention in order to provide a basic understanding of some aspects thereof. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

Provided here are reliable, cost-effective, and compact LED chips that are useful as light sources. Described herein is a compact architecture formed by stacking a diamond sensor on a single LED chip, which serves as a proximity light source for NV excitation. Both the size (~mm³ volume) and the cost of this approach are significantly reduced, and the integrated device is portable, which enhances practical applications.

Disclosed herein are optoelectronic chips containing an LED chip having embedded therein a diamond with nitrogen-vacancy centers, wherein the LED chip generates light having a first wavelength, and the diamond with nitrogen-vacancy centers generates light having a second wavelength after excitement with light having the first wavelength.

Also disclosed are quantum sensing devices made of an LED chip; a diamond with nitrogen-vacancy centers embedded in the LED chip or adjacent to the LED chip, wherein the LED chip generates light having a first wavelength and the diamond with nitrogen-vacancy centers generates light having a second wavelength after excitement with light having the first wavelength; a microwave antenna with one side adjacent to the LED chip; a photodiode on another side of the microwave antenna; and a light modulator between the LED chip and the diamond.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF SUMMARY OF THE DRAWINGS

FIG. 3A depicts a schematic diagram of the experimental details, FIG. 3B shows the measured emission spectrum of the LED and fluorescence spectrum of NV centers excited by LED (applied current=10 mA), FIG. 3C shows the saturation curve under varying applied current to LED, and FIG. 3D shows the typical ODMR spectrum of arbitrarily chosen diamond nanoparticles containing ensemble NV centers.

FIGS. 4A-4D depict schematics showing the different designs of diamonds integrated with LED chip, wherein FIGS. 4A-4C show parallel light coupling path with the diamond (i.e. bulk diamond, diamond nanoparticle) sitting on the LED chip, FIGS. 4D-4E show an orthogonal light coupling path, where the diamond (i.e. bulk diamond, diamond nanoparticle) is sitting beside the LED chip, and FIGS. 4F-4G shows combined light coupling paths, where the diamond can be embedded inside a sapphire plate of an LED (e.g., in a flip-chip LED).

FIG. 5A shows a diamond sitting on top of a face-up LED, FIG. 5B shows a diamond sitting on top of a flip-chip LED, FIG. 5C shows a diamond sitting beside a flip-chip LED, and FIG. 5D shows a diamond sitting inside a flip-chip LED. The left panels are the schematic showings of the architectures, the middle panels are the 3D view and the right panels are the cross section views, respectively. The size of the LED chip is 1 mm×1 mm×0.15 mm, and is the same for diamond in FIGS. 5A-5C, the size of diamond in d is 0.3 mm×0.3 mm×0.15 mm). The excited power from LED is set as 2 W.

DETAILED DESCRIPTION OF EMBODIMENTS OF THE INVENTION

Figure 1:
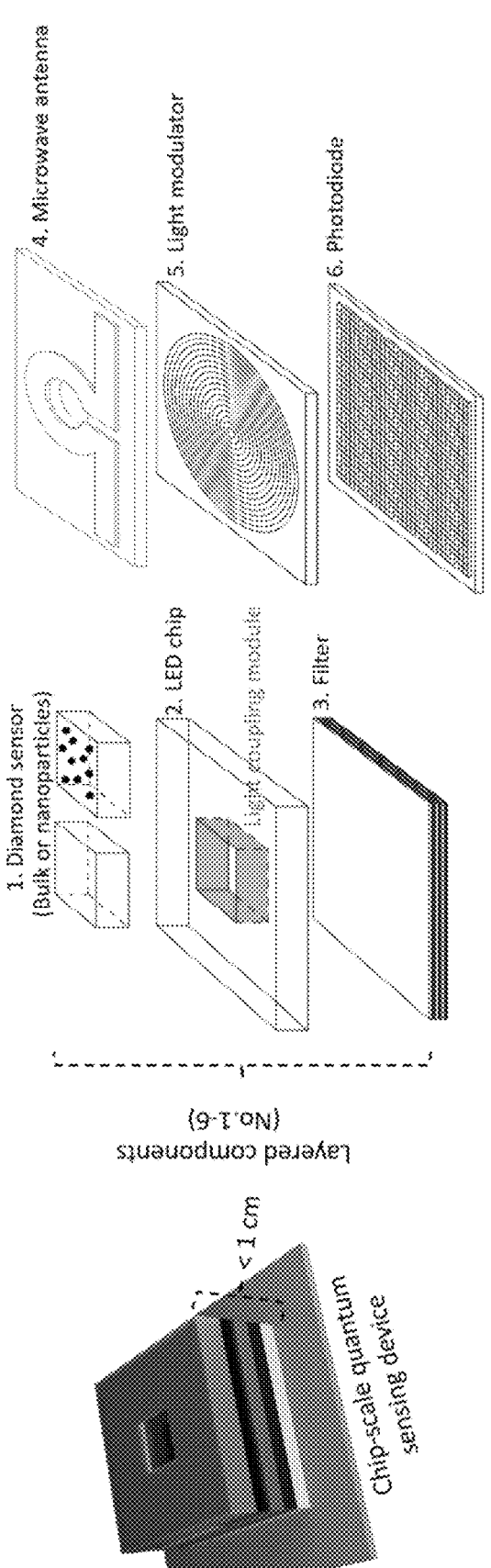
FIG. 1 depicts the conceptual design of a hybrid chip architecture for quantum sensing. The proposed chip-scale quantum sensing device, with all the layered components on sub-centimeter-scale footprints, is capable of performing NV-based quantum sensing with improved performance.
Figures 2A, 2B, 2C, 2D:
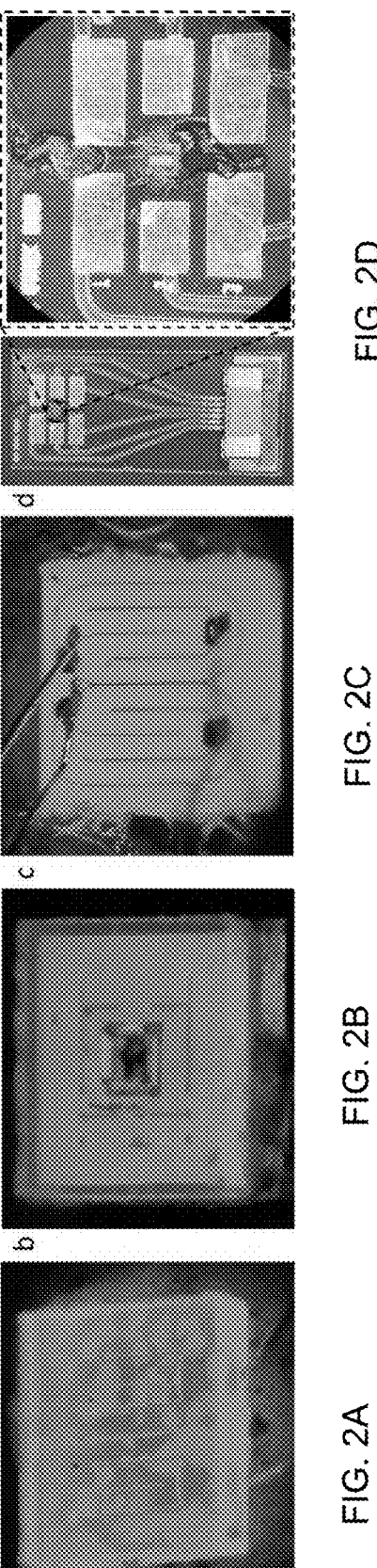
FIG. 2A depicts data of an optical image of a packaged Flip-chip LED.
FIG. 2B is an image of a Flip-chip LED with a laser-cut hole in the center.
FIG. 2C is an image of a face-up LED operated at a bias current of 1 mA.
FIG. 2D is an optical image of the fabricated face-up LED chip mounted on a PCB board, with a laser-cut bulk diamond plate (red arrow) sitting on top. The size of the LED chip is 1000 μm (L)×1000 μm (W)×150 μm (H), the hole b is 200 μm (L)×200 μm (W), and the size of diamond d is 420 μm (L)×700 μm (W)×300 μm (H).

Quantum sensing based on nitrogen vacancy (NV) centers in a diamond, a kind of optically addressable point defect, presents technical opportunities. This quantum technology is mainly achieved with a bulk-optical approach (sub ~$m^3$ volume), e.g., a free-space laser with various optical components sitting on an optical table for NV excitation. Such a laser-based system is costly and discrete for control and measurement, severely limiting its practical deployment. As described herein, however, a compact chip architecture (sub ~$mm^3$ volume) is capable of on-chip quantum sensing, by stacking a diamond sensor on an optoelectronic chip. Specifically, a gallium-nitride (GaN) light emitting diode (LED) chip is used as a proximity light source for exciting NV centers, and is applied without the need for any additional optical elements. Furthermore, the currently developed method of assembling a diamond to an LED chip optimizes the on-chip light-NV spin interaction. The developed device significantly improves the scope and scale of quantum sensing, rendering applications over a vast range of areas not possible by a conventional apparatus.

In embodiments where a gallium-nitride (GaN) light emitting diode is employed, light generated therefrom typically has a wavelength from 375 nm to 521 nm.

In experiments on the fabrication of the proposed chip-scale system, a hybrid device consisting of diamond integrated onto LED is fabricated as shown in FIGS. 2A-2D. Specifically, a GaN LED chip is first surface coated with a designed DBR reflector (top) on both sides using chemical vapor deposition (CVD). Then the inner region of chip is cut using laser micromachining, thereby facilitating the insertion of a diamond sample. The gap between the diamond sample and GaN chip is then filled with optical adhesive glue (e.g., NOA61, Thorlabs) for efficient light coupling. Next, the chip (with inserted diamond) is adhered to a microwave structure on a PCB board. The chip is glued with a thin transparent substrate (e.g., cover glass) coated with a band-pass filter on its surface, and is subsequently attached to a photodiode. Finally, the fabricated device is connected to an external power source and other control electronic components to fabricate the functioning device.

In experimental tests of optically detected magnetic resonance (ODMR) measurements using the proposed system, micron/nano-sized diamond particles containing many NV centers were adopted. These diamond particles "sit" on top of LED chip due to optical adhesive glue and were used for an investigation using an existing wide-field diamond microscope (see FIG. 3A). In such a configuration, the excitation is created by a proximity LED chip while the detection still relies on the conventional lens-based approach. The detailed experimental setup, measured fluorescence spectrum, saturation curve, and typical optically detected magnetic resonance (ODMR) spectrum of ensemble NV centers in diamond particles excited by a LED chip, are shown in FIGS. 3B-3D. Particularly, the ODMR spectra is considered as the hall mark of NV-based quantum sensing. These initial tests indicate the feasibility of using an LED chip as a light source for NV-based quantum sensing. In these tests, a signal-to-noise ratio (SNR) ~9 is already obtained when a parallel light coupling path is adopted, and it is anticipated that this value can be continuously improved when an orthogonal path is used.

In embodiments where a gallium-nitride (GaN) light emitting diode is employed to excite the NV centers, light generated from the NV centers typically has a wavelength from 625 nm to 700 nm.

Figures 4A, 4B, 4C, 4D, 4E, 4F, 4G:
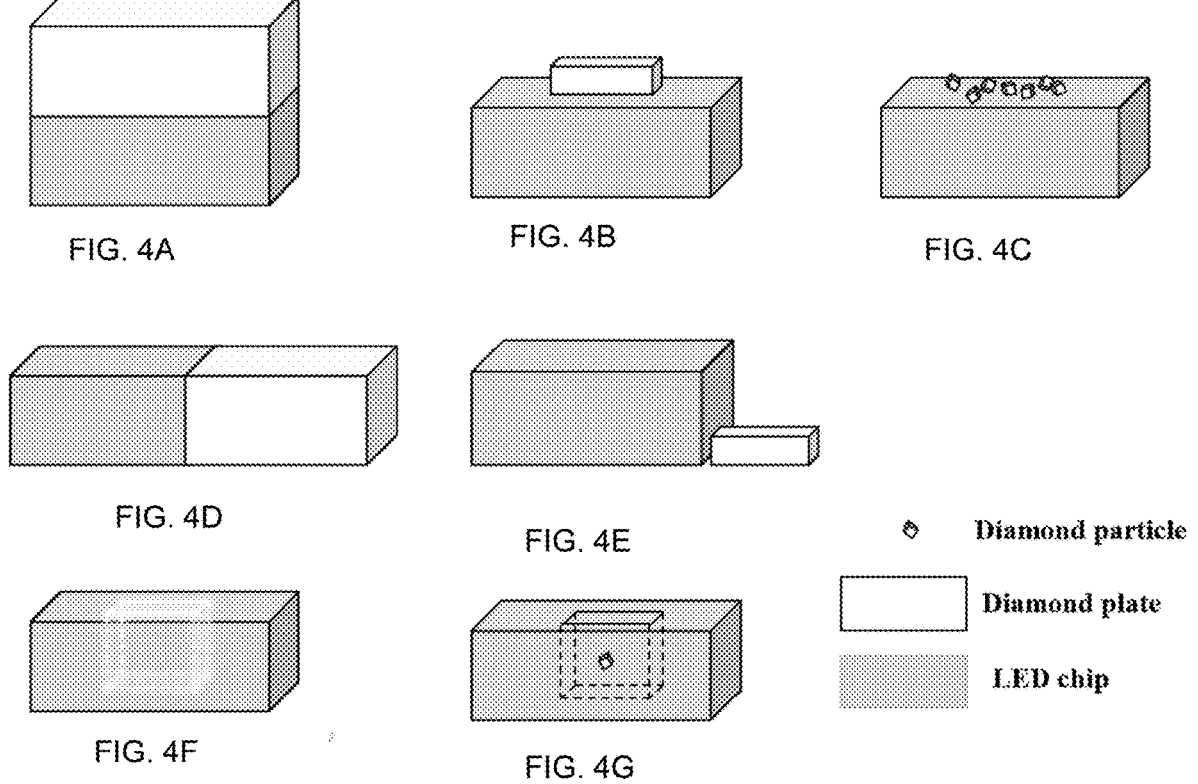

Different arrangements (designs) of diamonds integrated with LED chips are shown in FIG. 4, where the bulk diamond or diamond nanoparticles are excited using an LED as a proximity light source. The light coming up from the LED directly excites the fluorescence of the NV centers, except in this case for the diamond directly sitting on top of the LED (see FIGS. 4A-4C). Putting the diamond beside the LED chip may be adopted (see FIGS. 4D-4E) which significantly reduces the influence of pumped green light on the collected NV fluorescence. Except the arrangements mentioned above, embedding diamond (see FIGS. 4F-4G) into the LED chip is also effective to increase the intensity of NV fluorescence because LED light from different sides is directed into diamond for NV excitation.

Figures 5A, 5B, 5C, 5D:
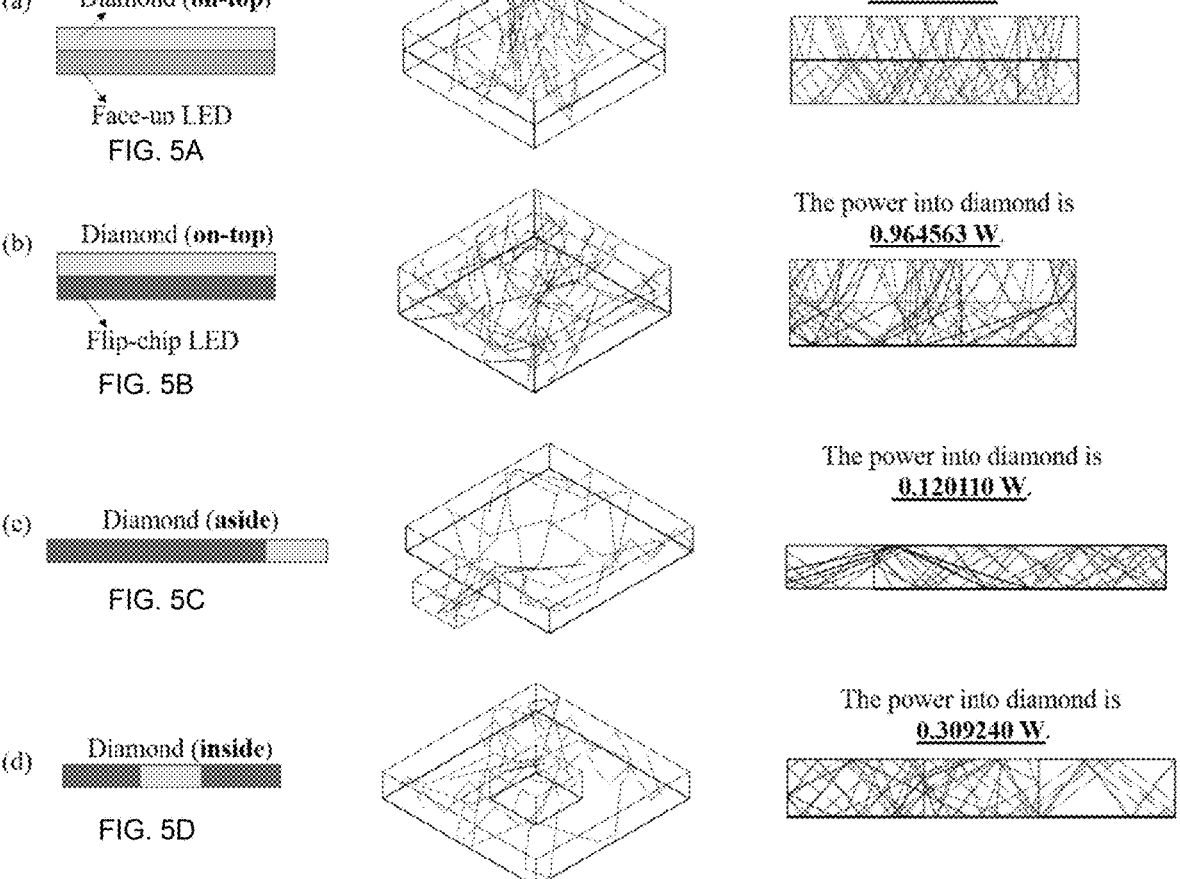
FIGS. 5A-D depict simulated rays distribution in the integrated device, where

Following the concept of chip-scale compact architecture, samples like diamond thin membrane are positioned in the proximity of a GaN LED chip (light source) to minimize the loss of optical power. This helps improve light use efficiency, which is normally low (~30% of initial power) in a conventional free-space laser approach. The optimized diamond assembly method (device architecture) is determined from simulated ray distribution in the integrated device (See FIG. 5). Based on the preliminary numerical investigations, it was noticed that a Flip-chip LED, with a top exposed sapphire surface, increases the efficiency of the light extraction from the quantum wells and further makes the device integration easier.

Unless otherwise indicated in the examples and elsewhere in the specification and claims, all parts and percentages are by weight, all temperatures are in degrees Centigrade, and pressure is at or near atmospheric pressure.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An optoelectronic chip, comprising:
an LED chip having embedded therein a diamond with nitrogen-vacancy centers, wherein the LED chip generates light having a first wavelength, and the diamond with nitrogen-vacancy centers generates light having a second wavelength after excitement with light having the first wavelength.

2. The optoelectronic chip according to claim 1, wherein the LED chip is a GaN LED chip.

3. The optoelectronic chip according to claim 1, wherein the diamond with nitrogen-vacancy centers comprises bulk diamond or diamond nanoparticles.

4. The optoelectronic chip according to claim 3, wherein the diamond nanoparticles are comprised within an optical adhesive glue.

5. The optoelectronic chip according to claim 1 having a size of 100 mm$^3$ or less.

6. The optoelectronic chip according to claim 1 having a size of 10 mm$^3$ or less.

7. The optoelectronic chip according to claim 1 having a size of 1 mm$^3$ or less.

8. The optoelectronic chip according to claim 1, wherein the LED chip is a GaN LED chip, and the first wavelength is from 375 nm to 521 nm.

9. The optoelectronic chip according to claim 1, wherein the LED chip is a GaN LED chip, and the first wavelength is from 375 nm to 521 nm, and the second wavelength is from 625 nm to 700 nm.

10. A quantum sensing device, comprising:
an LED chip;
a diamond with nitrogen-vacancy centers embedded in the LED chip, wherein the LED chip generates light having a first wavelength, and the diamond with nitrogen-vacancy centers generates light having a second wavelength after excitement with light having the first wavelength;
a microwave antenna, one side of the microwave antenna adjacent the LED chip;
a photodiode on another side of the microwave antenna; and
a light modulator between the LED chip and the diamond.

11. The quantum sensing device according to claim 10, wherein the diamond with nitrogen-vacancy centers is embedded in the LED chip.

12. The quantum sensing device according to claim 10, wherein the diamond with nitrogen-vacancy centers is adjacent to a first surface of the LED chip, and the microwave antenna is adjacent to a second surface of the LED chip.

13. The quantum sensing device according to claim 10, wherein the LED chip is a GaN LED chip.

14. The quantum sensing device according to claim 10 having a size of 100 mm$^3$ or less.

* * * * *